United States Patent [19]

Holzl

[11] 4,162,345
[45] Jul. 24, 1979

[54] DEPOSITION METHOD AND PRODUCTS

[75] Inventor: Robert A. Holzl, La Canada, Calif.

[73] Assignee: Chemetal Corporation, Pacoima, Calif.

[21] Appl. No.: 849,122

[22] Filed: Nov. 7, 1977

Related U.S. Application Data

[63] Continuation of Ser. No. 702,436, Jul. 6, 1976, abandoned, which is a continuation-in-part of Ser. No. 588,391, Jun. 19, 1975, abandoned, which is a continuation-in-part of Ser. No. 358,110, May 7, 1973, abandoned.

[51] Int. Cl.² .............................................. C23C 29/00
[52] U.S. Cl. .................. 428/328; 427/248 B; 427/249; 427/252; 427/295; 427/319; 428/539
[58] Field of Search ............... 427/248 C, 248 B, 249, 427/252, 295, 319; 428/328, 539

[56] References Cited

U.S. PATENT DOCUMENTS 3,574,672   4/1971   Tarver .................................. 427/249

Primary Examiner—Bernard D. Pianalto
Attorney, Agent, or Firm—Fitch, Even & Tabin

[57] ABSTRACT

A method for producing a hard deposit on a substrate is described wherein a volatile halide of tungsten or molybdenum is reacted with a gas or gases containing hydrogen, oxygen and carbon to effect the deposition on a substrate of a compound of the metal in a liquid phase. The liquid phase deposited on the substrate is then reacted to remove oxygen and halogen and produce a hard deposit containing the metal and carbon. Also described are products which may be produced by the above method.

23 Claims, 3 Drawing Figures

DEPOSITION METHOD AND PRODUCTS

This is a continuation of application Ser. No. 702,436, filed July 6, 1976 and now abandoned and which is a continuation-in-part of application Ser. No. 588,391 filed June 19, 1975 and now abandoned, which was a continuation-in-part of application Ser. No. 358,110 filed May 7, 1973, also now abandoned.

This invention relates to the production of hard deposits on substrates. More particularly, the invention relates to the production of deposits on substrates as coatings, or the production of free standing objects made from a deposit after removal of a substrate. The deposits of the invention have physical characteristics which are substantially improved over those presently known to those skilled in the art.

The production of high hardness materials for wear or cutting purposes has been approached in a variety of ways. High carbon steel has often been employed, frequently utilizing alloying ingredients such as chromium, vanadium, tungsten, molybdenum, cobalt, and others to improve hardness, toughness and strength at various operating temperatures. Cast cobalt alloys, such as "Stellites" and similar materials, have also been used for wear and cutting products. Another type of material has been composites of tungsten carbide or other carbides cemented with cobalt or nickel.

High carbon steel, with or without other alloying ingredients, has excellent bend strength, particularly at use temperature near room temperature, and quite high impact strength. High carbon steel, however, does not offer satisfactory hardness for wear-resistant and cutting tool products, its hardness being about Vickers number 900 (Vickers hardness numbers are in kg/mm$^2$ and are designated in the claims herein as VHN) or a Rockwell C hardness of about 65 to 70. Thus, high carbon and similar tool steels have certain limits on their use.

Cast cobalt alloys, particularly those having high percentages of carbon and metal alloying species such as chromium, tungsten and others, have hardness values similar to those of high carbon steel. Moreover, they maintain good hot hardness. However, these materials are more difficult to fabricate than high carbon steel, generally cost more, and are quite brittle.

In order to overcome the physical and mechanical shortcomings of the aforementioned products and the difficulty in manufacturing them, attempts have been made to produce these materials by deposition. High hardness materials are used as coatings on various types of substrates or are formed into free standing objects to produce wear parts or tool products. For example, commerically successful products having coatings of titanium carbide over cemented tungsten carbide have been produced. Hardnesses of over 3000 Vickers with improved friction characteristics have been achieved. By way of further example, some small diameter tubing of tungsten carbide has been produced by deposition on a mandrel which is subsequently removed.

Deposits which have been produced commercially thus far, both for coating substrates and for producing free standing objects, have suffered certain drawbacks. Although hardness appears to be satisfactory in some cases, the strength and toughness of the material has often been lower than desired. Typically, such deposits have been produced by chemical vapor deposition techniques and have resulted in columnar grain structures wherein the grain size is relatively large. Because of the grain size and the columnar distribution of the grains, such deposits have tended to be relatively brittle and mechanically weak. Moreover, the production of hard coatings has generally required the use of a relatively high substrate temperature and relatively low deposition rate during the chemical vapor deposition process.

It is an object of the present invention to provide an improved method for producing coated substrates and free standing hard metal products.

Another object of the invention is to provide coated substrates and free standing hard metal products having improved physical characteristics.

Another object of the invention is to provide, on substrates, improved deposits of superior strength and quality.

It is another object of the invention to provide coated substrates with the coating having extremely high hardness and strength, and free standing hard metal objects of great strength.

Other objects of the invention will become apparent to those skilled in the art from the following description, taken in connection with the accompanying illustrations wherein.

Very generally, the method of the invention comprises providing a volatile halide of tungsten or molybdenum. The volatile halide is reacted, off the surface of the substrate in the presence of a gas or gases containing hydrogen, oxygen, and carbon to form a first intermediate compound of tungsten or molybdenum. The first intermediate compound is reacted in the presence of gaseous hydrogen and one or more gases containing oxygen and carbon to cause the deposition on the substrate of a second intermediate compound of the metal which is in a liquid phase. (The term substrate is used herein in its broadest sense and is intended to include any form upon which the coating is deposited, whether subsequently used in the bonded condition or dispensed with after deposition such as a mandrel or die.) The liquid phase second intermediate compound is then reacted on the substrate surface to produce a hard deposit containing tungsten or molybdenum and carbon.

Figure 1:
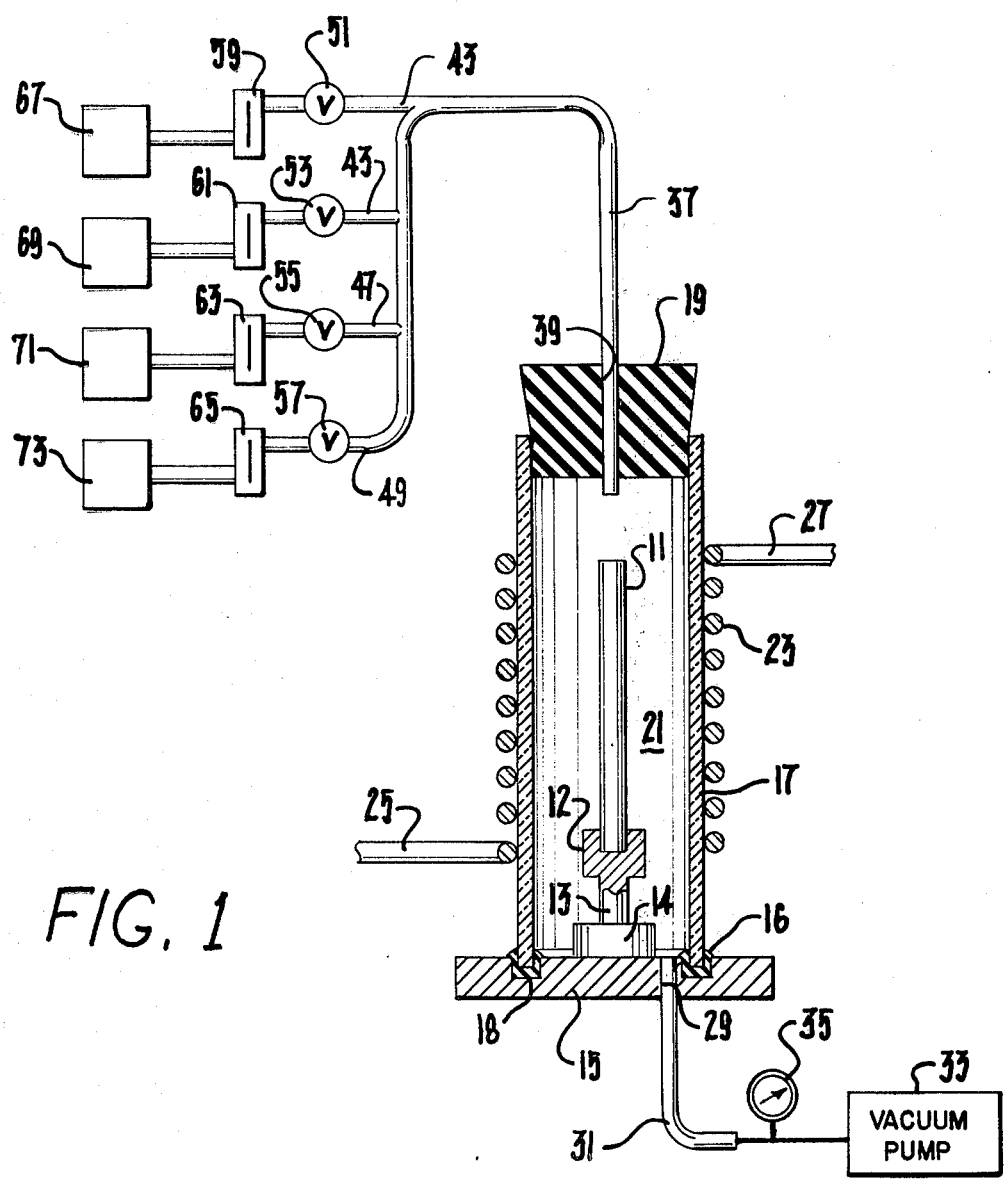
FIG. 1 is a schematic diagram of a chemical vapor deposition system which may be employed in the practice of the method of the invention.

Chemical vapor deposition, or CVD, is a well-known process for producing a coated substrate. In FIG. 1, one common apparatus is illustrated which is used for coating a substrate 11, the latter being shown as a generally cylindrical rod. The rod 11 is supported in a work holder or fixture 12 supported from a rod 13 resting on a disc shaped base 14. The disc shaped base 14 is supported on a reactor base 15 which is provided with an annular groove 16 therein.

The reactor is completed by a heat proof cylindrical walled tube 17 of quartz or similar material which seats in the annular groove 16 and is sealed therein by an annular seal 18. The top of the quartz tube 17 is closed by a rubber stopper 19 of conventional design removably secured therein. There is, therefore, defined a reaction chamber 21 in which the deposition process takes place.

In order to heat the substrate 11 to the desired temperature, as will be explained, an induction heating coil 23 is provided surrounding the outer wall of the glass or quartz tube 17. The induction heating coil 23 is supported by means not shown and is provided with leads 25 and 27 to which the induction heating current is conducted from a suitable source, also not shown.

In order to regulate the pressure within the reaction chamber 21 and removed reaction product gases, the lower wall or base 15 of the reactor is provided with an opening 29 therein through which a tube 31 is passed. The tube 31 is suitably connected to a vacuum pump 33 and a vacuum gauge 35 is connected in the line thereto for indicating the pressure within the chamber 21. By properly operating the vacuum pump 33, the pressure within the chamber 21 may be regulated as desired.

A gas inlet tube 37 is provided in the rubber stopper 19 through a central opening 39 therein. The tube 37 is connected through a plurality of tubes 43, 45, 47 and 49 to regulator valves 51, 53, 55 and 57 and flowmeters 59, 61, 63 and 65, respectively.

Sources of reactant gas 67, 69, 71 and 73 are connected to the flowmeters 59, 61, 63 and 65, respectively, for introducing the desired reactive gases for producing the chemical vapor deposition reactions within the chamber 21, as will be subsequently described.

A known method in which a coating of high hardness is produced on a substrate by chemical vapor deposition involves the introduction to the reaction chamber 21 of a volatile compound of the metal species desired in the deposit. Typically, this is a metal halide. This material, in gaseous form, is passed over a heated substrate, on which heated surface it is decomposed to deposit the metal of interest. A gaseous reducing agent, such as hydrogen, may be mixed with the volatile compound of the metal to assist in reducing it on the heated surface of the substrate. Other gaseous compounds may be added to the gas stream, such as carbon bearing gases, whereby compounds of the metal, such as carbides, are formed by chemical reaction on the heated surface. A more complete explanation of the chemical vapor deposition process may be found in Chapter 13 of the book "Vapor Deposition" edited by Powell, Oxley and Blocker, published by Wylie & Sons, 1966.

Figure 2:
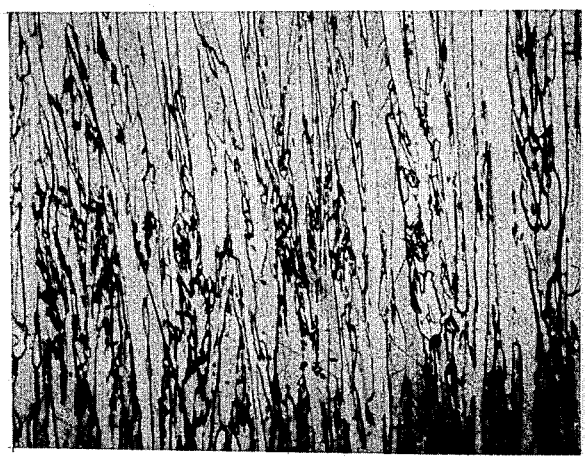
FIG. 2 is a photomicrograph at about 200 times magnification of a cross section of a deposit produced in accordance with prior art chemical vapor deposition techniques.

In FIG. 2, a cross sectional photomicrograph, magnified 200 times, shows a coated substrate produced by typical prior art CVD techniques, more specifically set out in Example 3 below. The specimen was etched in a mixture of dilute nitric and dilute hydrofluoric acid for about 30 seconds at room temperature. It may be seen that the deposit is comprised of relatively large columnar grains which are oriented perpendicularly of the substrate surface. Such deposits are typically quite brittle.

In each case involving the practice of chemical vapor deposition, effort is made to insure that the chemical reactions which cause the deposition take place on the surface of the substrate. In other words, a reaction is caused which directly produces a solid deposit from the gaseous reactant or reactants on the surface of the substrate or mandrel. Heretofore, if the reaction was allowed to proceed in the gas stream away from the heated surface, powdery non-adherent and non-coherent deposits were made.

The method of the present invention, although similar to chemical vapor deposition, is not truly that. The method of the invention employs a deposition apparatus essentially similar to a chemical vapor deposition apparatus, however, the apparatus is operated in such a manner that the typical chemical vapor deposition process does not take place.

In accordance with the method of this invention, a sequence of events is made to take place which is different from what has been believed desirable by those skilled in the art. It has been discovered that superior deposits can be produced by causing a chemical reaction off of the surface of the substrate resulting in a first intermediate product in a gaseous phase. This product is further reacted to result in a second intermediate product which is deposited on the substrate or mandrel in a liquid phase. The liquid phase on the substrate is further reacted to form the desired solid phase.

Such reactions may be possible with compounds of a number of metals, including the Group IVB, VB and VIB metals. However, the present invention is directed to producing a deposit comprised of tungsten or molybdenum, and carbon. The general chemical characteristic required is that the volatile halide of the metal portion of the compound must be able to be reacted off the surface of the substrate to produce a first intermediate metallic compound in a gaseous or vaporous phase. This first intermediate compound must then be able to be reacted to form a second intermediate compound having the proper vapor pressure and melting temperature such that this second intermediate compound is deposited on the substrate or mandrel as a liquid. The reaction to produce this second intermediate and relatively non-volatile compound must be relatively fast. The compound must then be able to be converted on the heated surface of the substrate by disproportionation or reaction with a gaseous species, or both, to the desired solid deposit.

The first intermediate compound is produced off of the surface of the substrate and is observable as a fog or white halo slightly upstream with respect to the substrate. Raising the reactor temperature, however, can prevent visible formation of the fog although the reaction still occurs. Although not entirely understood, it is known that for this reaction to take place, there must be present hydrogen and oxygen, and possibly also carbon. The hydrogen should be in some other form than pure hydrogen gas because pure hydrogen does not readily react at room temperature in the diatomic state. Pure hydrogen, however, is required for the later reactions as explained below. The volumetric ratio of the total amount of hydrogen present to the volatile halide should be equal to or less than stoichiometric amounts. In other words, the ratio of the flow rate of hydrogen to the flow rate of the volatile halide should be equal to or less than the ratio of the number of gram atoms of hydrogen to the number gram atoms of volatile halide in the balanced reaction. At hydrogen ratios higher than this, conventional chemical vapor deposition tends to take place, (i.e. direct deposition from the gaseous to the solid phase) with the resultant brittle, columnar grained product. Preferably, the hydrogen to volatile halide volume ratio should be greater than about 0.5 to 1 for adequate yield in the reaction. The first intermediate compound is believed to be some form of the metal in the same valence state as it exists in the initial halide (for example hexavalent tungsten).

The first intermediate compound is then reacted in the vicinity of the substrate surface due to the high heat of the substrate and the presence of hydrogen. The result is the deposition on the substrate of a low vapor pressure liquid in a very thin and highly viscous layer. The nature of this liquid second intermediate compound is not understood, however, it is believed to be the metal in some intermediate valence state combined with oxygen, carbon, or both, as well as a halogen. For example, the liquid may be an inorganic polymer. The liquid nature of the second intermediate compound is often apparent on the surface of the substrate during the deposition process. It is, however, believed that the liquid always forms even though not always easily observed.

The liquid second intermediate compound is then reacted to form the desired solid deposit. This reaction is believed to involve reduction, disproportionation, or both. In any event, the oxygen and any remaining halogen are removed, possibly by reaction with the hydrogen or merely by being carried away with the flow of the hydrogen. The resultant deposit contains the metal and at least about 0.1% and not greater than about 1% carbon by weight. The deposit is a very fine-grained, non-columnar structure, often glass-like in appearance. Some layering is detectable in the deposit under high magnification and is believed to be related to variations in the reaction rates relative to each other. It is postulated that the fine-grained structure results from the extremely rapid conversion of the intermediate liquid phase to a solid by chemical reaction. X-ray diffraction analysis shows the deposit is akin to tungsten but with a very finely dispersed carbide, probably in the form WC.

The carbon level is significant. Too much carbon results in a product which is too hard or too brittle. It is believed that all of the carbon exists in the deposit as a dispersed carbide. For higher quantities of carbide in the deposit, the hardness tends to increase, but at the expense of also increasing the brittleness of the deposit. The total volume of the carbon bearing gases relative to the volatile halide of the metal serves to control the proportion of carbon in the solid deposit. Too much carbon results in a brittle deposit. Too little carbon results in the deposition of pure tungsten with columnar grains. It is preferred, for the best operation of the process, that in the gas stream the ratio of gram atoms of carbon to gram atoms of the metal should not exceed unity, and should be greater than 0.03 to 1.

The amount of carbon introduced is also dependent upon the oxygen in the system. Preferably, the ratio of gram atoms of carbon to gram atoms of oxygen in the accumulation of gases introduced should not exceed a ratio of about 3 to 1. If this ratio is exceeded, too much carbon is present in the system and the resultant deposit becomes too hard and brittle.

The preliminary reaction is caused to occur by reacting the volatile halide of the metal with a gaseous substance containing hydrogen and oxygen. Elemental oxygen may be used or oxygen bearing volatile compounds. In fact, it is most convenient to use a material which contains both carbon and oxygen since, when employed under proper conditions, it can serve as both the source of oxygen for the intermediate liquid product and the source of carbon to form the final solid deposit. The suitable reacting gases, therefore, include volatile compounds containing hydrogen, carbon and oxygen. Examples of the latter are alcohols such as methyl and ethyl alcohols, ketones such as acetone, ethers such as ethyl ether, and ethylene oxide.

In order to assure that a liquid phase is deposited on the substrate, the deposition temperature is held between about 650° C. and 1100° C. Too high a temperature volatilizes the liquid, whereas too low a temperature makes the reaction rate unacceptably low. Using the oxygen from one of the above reactants to form the liquid phase deposition, the conversion to the solid hard metal is accomplished by disproportionation or by reacting this liquid phase with hydrogen and one or more of the carbon bearing gases. A combination of both reactions may actually occur.

At higher temperatures in the aforementioned range, a lower hydrogen ratio is required, and conversely, at lower temperatures, a higher hydrogen ratio is required. Lower operating temperatures than the specified range typically result in deposits which are too brittle, whereas operating temperatures exceeding the specified range typically result in columnar deposits or in non-adherent powder. The preferred operating range is about 800° C. to 950° C. Since the reaction or reactions occurring are exothermic, heat builds up in the reactor very quickly. If the reactor is too hot, the reaction which causes the first intermediate compound to change to the second intermediate compound may occur off of the surface of the substrate, preventing deposition.

The operating pressure is preferably about 50 Torr or higher and successful deposits have been achieved up to one atmosphere pressure. Typically, the higher the pressure, the higher the deposition rate. If too low a pressure is used (or too high a temperature) the volatility of the liquid second intermediate compound may be exceeded, resulting in a failure of the deposition process.

Figure 3:
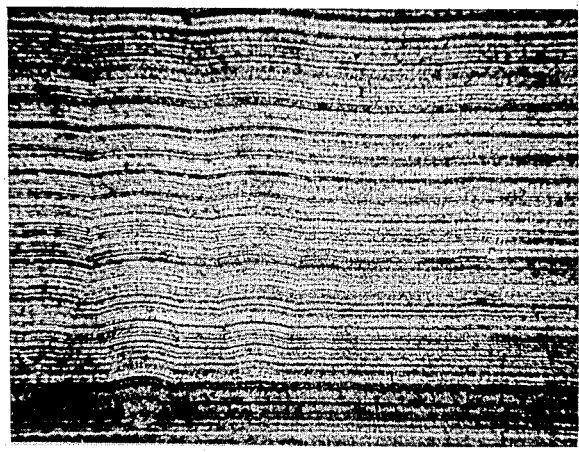
FIG. 3 is a photomicrograph at about 500 times magnification illustrating a cross section of a deposit produced in accordance with the invention.

The resultant thermochemically deposited product is substantially free of columnar grains. An example is shown in FIG. 3, which is a deposit produced under the conditions set forth in Example 2 set out below. The cross sectional photomicrograph was produced by etching in a mixture of dilute nitric and hydrofluoric acids for about 30 seconds at room temperature. In the case of tungsten-carbon deposits, the Vickers hardness number typically exceeds 1000 kg/mm$^2$ with a modulus of rupture in bending greater than 200 kg/mm$^2$ in the deposited and heat treated condition. The surface in the as-deposited condition is smooth and the grain size is generally equal to or less than 5 microns, typically less than one micron, giving a glass-like or vitreous appearance.

As may be seen from FIG. 3, the deposit is laminar in appearance, with the layers appearing to be of the order of 2000 Å thick. Although not yet understood, it is believed these layers are caused by varying conditions during deposition as evidenced by oscillating turbulence in the fog or halo off the substrate. It is postualed that such layers have different carbon content and may anneal at different rates during deposition. This may result in a complex internally stressed structure in which the layers closest to the substrate are prestressed to a substantial degree of compression.

To assist in the understanding of the invention, certain samples of the deposition techniques are given:

EXAMPLE 1

A 0.508 mm tungsten seed wire was used for a mandrel and heated by the passage of current through the wire. The specimen temperature was held at 950° C. Flows of gases were: tungsten hexafluoride, 350 ml/min, hydrogen 430 ml/min, argon 550 ml/min, and methanol, started at 70 ml/min and increased regularly during the run to 100 ml/min. The total pressure was 430 Torr. The deposition rate was 20 microns/min. The run time was 17 minutes and 45 seconds. A white halo was observed surrounding the substrate during deposition, indicating the presence of the first intermediate compound, and a liquid deposit on the substrate was continuously detectable, indicating the second intermediate compound. The as-deposited material had a bend strength of 1,040 kg/mm$^2$ and a Vickers hardness number (500 gram weight) of 1,480 kg/mm$^2$. The metallograph showed a lamellar deposit, like FIG. 3, with essentially absence of columnar grains. The Youngs modulus of elasticity was 53,200 kg/mm$^2$.

EXAMPLE 2

A 3 mm molybdenum rod was used for a mandrel heated to a temperature of 960° C. at a reactor pressure of 400 Torr. The hydrogen flow was set at 595 ml/min, a diluent flow of argon was set at 540 ml/min, a flow of tungsten hexafluoride was set at 740 ml/min, and a flow of dimethyl ether was set at 35 ml/min. A 0.45 mm deposit was produced on the mandrel in 15 minutes. The deposit had very fine non-columnar grain structure with a hardness of 1670 kg/mm$^2$ and a transverse rupture strength of 295 kg/mm$^2$.

EXAMPLE 3

The same conditions stated in Example 2 were repeated except that a flow of 25 ml/min. of acetone was substituted for the dimethyl ether. A 0.9 mm coating was deposited in twenty minutes and exhibited a Vickers hardness of 1930 kg/mm$^2$ and a transverse rupture strength of 274 kg/mm$^2$.

EXAMPLE 4

The conditions of Example 2 were repeated using molybdenum hexafluoride instead of tungsten hexafluoride and using methanol at 70 ml/min, instead of dimethyl ether. A 0.3 mm deposit was built up in 15 minutes and tested at a Vickers hardness number 1280 kg/mm$^2$ and a transverse rupture strength of 253 kg/mm$^2$. In this case, as in the case of Examples 2 and 3, the deposit was very fine grained and the grains were non-columnar in their distribution.

EXAMPLE 5

The deposition experiment of Example 1 was rerun using identical conditions except that methane was substituted for methanol in equivalent volumetric proportions. The methane contained the same amount of carbon but, of course, no oxygen. The resultant deposition was 0.375 mm in thickness with a rough exterior surface showing tetragonal crystal facets. The surface roughness was measured at approximately 64 rms. The measured hardness was 1380 kg/mm$^2$ and the bend strength 60 kg/mm$^2$. The elastic modulus was unable to be measured because of the intrinsic brittleness of the material. A heat treat at 1150° C. for 15 minutes did not improve the strength of the material. No halo about the part was observed during deposition nor was any liquid on the surface of the substrate detectable during deposition. Metallographic examination showed a typical chemcial vapor deposition columnar deposit similar to that shown in FIG. 2. Example 2 was clearly outside the limits of the invention since there was no oxygen addition to effect the intermediate liquid deposit.

EXAMPLE 6

An experiment was conducted to compare the method of the invention with more conventional CVD techniques. Tungsten hexafluoride was flowed over a 0.508 mm diameter molybdenum wire at a rate of 140 ml/min with hydrogen at a flow of 420 ml/min and carbon monoxide at a flow of 560 ml/min. The wire was held at a temperature of 800° C. Deposition occurred at a rate of 20 $\mu$/min. No fog was observed in the chamber nor was any liquid apparent on the wire. Rather, a finely divided black powder was deposited on the chamber walls. The resultant deposit had a fine-grained, dull, metallic appearance. A metallographic specimen showed fine grain columnar crystals extending radially from the surface with some cylindrical rings superimposed. Hardness of the material was 2,000 kg/mm$^2$ as measured with a 500 gram weight on a Vickers hardness tester. Modulus of rupture in bending was 110 kg/mm$^2$. Failure on the Bend Test was intergranular, i.e. as compared with the typical diagonal, or near axial breaks of samples by the method of the invention.

The tungsten-carbon deposits of the invention appear on the average to be slightly harder than equivalent tungsten-carbide made by prior art techniques. This is dependent, of course, on the ratios of metal to carbon in the gas stream. At the highest preferred ratios, Vickers hardness numbers of up to 2500 kg/mm$^2$ are achieved. In addition, unusually high bend strengths are achieved. Typical bend strengths for hot pressed tungsten carbide rarely exceeds about 50 kg/mm$^2$, whereas, tungsten-carbon deposits made by the method of the invention will frequently exceed 300 kg/mm$^2$. This last strength number actually exceeds the strength of cemented tungsten carbides. The unusual high strength is believed to be related directly to the fine grain laminar grain structures such as illustrated in FIG. 3. The modulus of elasticity before or after heat treating is equal to or greater than 50,000 kg/mm$^2$.

It may therefore be seen that the invention provides an improved method for producing a coated substrate, as well as improved quality coated substrates. The structure of the coating composition is such as to provide superior physical qualities. More particularly, in the case of tungsten carbide deposits, the deposits are smooth surface fine grained randomly distributed crystals essentially free of columnar orientation and having a very high modulus of rupture. By subsequent heat treating, such tungsten carbide deposits may be almost doubled in their modulus of rupture. Molybdenum-carbon alloy systems can also be effectively improved in their deposit quality in accordance with the invention. Parameters necessary to do this are readily determinable by those skilled in the art from the information contained herein combined with that contained in "Techniques of Metals Research", R. F. Bunshah, Ed., Interscience Publishers, Div. of J. Wylie and Sons, New York, New York, 1968, Volume 1, Chapter 33.

Various modifications of the invention in addition to those shown and described herein will become apparent to those skilled in the art from the foregoing description and accompanying drawings. Such modifications are intended to fall within the scope of the appended claims.

What is claimed is:

1. A method for producing a hard deposit on a substrate, comprising, providing a gaseous volatile halide of tungsten or molybdenum, reacting said volatile halide spaced from the surface of the substrate in the presence of an alcohol, ketone or ether to form a first intermediate compound of tungsten or molybdenum which is spaced from the surface of the substrate, reacting said first intermediate compound in the presence of gaseous hydrogen and one or more gases containing oxygen and carbon to cause the deposition on the substrate of a second intermediate compound of tungsten or molybdenum which is in a liquid phase, and reacting the liquid phase second intermediate compound on the surface of the substrate to produce a hard deposit containing essentially tungsten or molybdenum and carbon and having a modulus of rupture in bending exceeding 200 kilograms per square millimeter.

2. A method according to claim 1 wherein the hard deposit is essentially tungsten and carbon.

3. A method for producing a hard deposit on a substrate, comprising, providing a gaseous volatile halide of tungsten, reacting said volatile halide spaced from the surface of the substrate in the presence of an alcohol, ketone or ether to form a first intermediate compound of tungsten which is in a gaseous phase spaced from the surface of the substrate, reacting said first intermediate compound in the presence of gaseous hydrogen and one or more gases containing oxygen and carbon to cause the deposition on the substrate of a second intermediate compound of tungsten which is in a liquid phase, and reacting the liquid phase second intermediate compound on the surface of the substrate to produce a hard deposit containing essentially tungsten and carbon and having a modulus of rupture in bending exceeding 200 kilograms per square millimeter.

4. A method for producing a hard deposit on a substrate, comprising, placing the substrate in a chemical vapor deposition reactor and heating the substrate to a temperature of between about 650° C. and 1100° C., providing a flow in the reactor of a gaseous volatile halide of tungsten or molybdenum, providing in the reactor a flow of hydrogen and of a gaseous alcohol, ketone or ether and controlling the relative amounts of volatile halid, hydrogen, oxygen, and carbon, the substrate temperature and the reactor pressure to form a gaseous compound of tungsten or molybdenum which is spaced from the surface of the substrate and to cause the deposition on the substrate of a compound of tungsten or molybdenum which is in a liquid phase and a subsequent conversion of said liquid phase to a hard deposit containing tungsten or molybdenum and carbon and having a modulus of rupture in bending exceeding 200 kilograms per square millimeter.

5. A method according to claim 4 wherein the ratio of hydrogen to the volatile halide is equal to or less than stoichiometric proportions.

6. A method according to claim 4 wherein the ratio of gram atoms of carbon to gram atoms of the tungsten or molybdenum in the gas stream does not exceed unity.

7. A method according to claim 4 wherein the ratio of gram atoms of carbon to gram atoms of oxygen in the gas stream does not exceed 3 to 1.

8. A method according to claim 4 wherein the temperature of the substrate is maintained between about 800° C. and 950° C.

9. A method for producing a hard deposit on a substrate, comprising, placing the substrate in a chemical vapor deposition reactor and heating the substrate to a temperature not exceeding about 1000° C., providing a flow in the reactor of a gaseous volatile halide of tungsten, providing in the reactor a flow of hydrogen and a gaseous alcohol, ketone or ether, wherein the ratio of hydrogen to the volatile halide is equal to or less than stoichiometric proportions, wherein the ratio of gram atoms of carbon to gram atoms of tungsten does not exceed unity, and wherein the ratio of gram atoms of carbon to gram atoms of oxygen does not exceed 3 to 1, and controlling the relative amounts of volatile halide, hydrogen, oxygen, and carbon, the substrate temperature and the reactor pressure to cause the deposition on the substrate of a compound of tungsten which is in a liquid phase and a subsequent conversion of said liquid phase to a hard deposit containing tungsten and carbon and having a modulus of rupture in bending exceeding 200 kilograms per square millimeter.

10. A method according to claim 9 wherein the flow of gases provided in the reactor includes hydrogen and methanol.

11. A method for producing a hard deposit on a substrate comprising providing a gaseous volatile halide of tungsten or molybdenum, reacting the volatile halide spaced from the surface of the substrate in the presence of gaseous hydrogen and ethyl alcohol, methyl alcohol, a ketone, or an ether to form a first intermediate compound of tungsten or molybdenum which is spaced from the surface of the substrate and to effect the deposition on the substrate of a second intermediate compound of tungsten or molybdenum which is in a liquid phase, and reacting the liquid phase deposit on the substrate in the presence of gaseous hydrogen and ethyl alcohol, methyl alcohol, a ketone or an ether to produce a hard deposit containing tungsten or molybdenum and carbon and having a modulus of rupture in bending exceeding 200 kilograms per square millimeter.

12. A method according to claim 11 wherein the volatile halide is reacted in the presence of a substance selected from the group consisting of methyl alcohol, ethyl alcohol, acetone, dimethyl ether, diethyl ether, and ethylene oxide.

13. A method according to claim 11 wherein the ratio of gram atoms of carbon to gram atoms of tungsten in the gas stream does not exceed unity.

14. A method for producing a hard deposit on a substrate, comprising, placing the substrate in a chemical vapor deposition reactor and heating the substrate to a temperature of about 650° C. to about 1100° C., maintaining a pressure in the reactor of between about 50 Torr and one atmosphere, providing in the reactor a flow of gaseous tungsten hexafluoride, gaseous hydrogen and a gaseous compound containing carbon, hydrogen and oxygen wherein the ratio of the gram atoms of the hydrogen to gram atoms of tungsten hexafluoride is between about 0.5 to 1 and 3 to 1, wherein the ratio of gram atoms of carbon to gram atoms of tungsten is between about 0.03 to 1 and about unity, wherein the ratio of gram atoms of carbon to gram atoms of oxygen is less than about 3 to 1, and controlling the relative amounts of tungsten hexafluoride, hydrogen, oxygen and carbon, the substrate temperature in the reactor pressure to produce a deposit on the substrate containing tungsten and a finely dispersed carbide and having a modulus of rupture in bending exceeding 200 kilograms per square millimeter.

15. A method according to claim 14 wherein the substrate temperature is between about 800° C. and 950° C.

16. A thermochemically deposited product consisting of a hard metal alloy, primarily of tungsten and carbon, free of columnar grains, having a hardness of greater than 1000 VHN with a modulus of rupture in bending of greater than 200 kg/mm$^2$ in the deposited or deposited and heat treated condition, said product containing between about 0.1 percent and one percent carbon finely dispersed in a form other than W$_2$C.

17. A product according to claim 16 containing between about 0.1 percent and one percent carbon as finely dispersed carbide in the form WC.

18. A product according to claim 16 wherein the product is laminar in appearance when cross sectioned and etched, with layers of the order of 2000 Å thick.

19. A product according to claim 16 having a grain size of less than one micron.

20. A coated substrate comprising a substrate having a coating thereon primarily of tungsten and carbon which is essentially free of columnar grains and which has a hardness greater than 2000 VHN, a grain size equal to or less than 5 microns, a modulus of rupture as deposited or as deposited and after heat treating equal to or greater than 200 kg/mm$^2$, a modulus of elasticity as deposited or as deposited and after heat treating of equal to or greater than 50,000 kg/mm$^2$, and a surface smoothness exceeding 4 rms in the as-deposited condition, said coating containing between about 0.1 percent and one percent carbon finely dispersed in a form other than W$_2$C.

21. A coated substrate according to claim 20 wherein the coating has a grain size of less than one micron.

22. A coating substrate according to claim 20 wherein the coating has a laminar appearance when cross sectioned and etched, with the layers having a thickness of the order of 2000 Å.

23. A coated substrate according to claim 20 wherein the coating contains between about 0.1 percent and 1 percent carbon as a finely dispersed carbide in the form WC.

* * * * *